United States Patent

Fujita et al.

[11] Patent Number: 5,962,962
[45] Date of Patent: Oct. 5, 1999

[54] METHOD OF ENCAPSULATING ORGANIC ELECTROLUMINESCENCE DEVICE AND ORGANIC ELECTROLUMINESCENCE DEVICE

[75] Inventors: Masato Fujita, Tokyo; Kenichi Fukuoka, Sodegaura, both of Japan

[73] Assignee: Idemitsu Kosan Co., Ltd., Tokyo, Japan

[21] Appl. No.: 08/793,932
[22] PCT Filed: Sep. 5, 1995
[86] PCT No.: PCT/JP95/01764
§ 371 Date: Mar. 5, 1997
§ 102(e) Date: Mar. 5, 1997
[87] PCT Pub. No.: WO96/08122
PCT Pub. Date: Mar. 14, 1996

[30] Foreign Application Priority Data

Sep. 8, 1994 [JP] Japan .................................. 6-214718
Jul. 21, 1995 [JP] Japan .................................. 7-185968

[51] Int. Cl.⁶ .................................................. H05B 33/04
[52] U.S. Cl. ........................ 313/412; 313/509; 313/512; 313/498; 445/38; 445/43; 445/44; 445/53
[58] Field of Search .................................. 313/509, 512, 313/498, 504; 445/38, 43, 44, 53

[56] References Cited

U.S. PATENT DOCUMENTS 4,446,399   5/1984   Endo et al. ............................. 313/512
4,810,931   3/1989   McKenna et al. ...................... 313/512

FOREIGN PATENT DOCUMENTS 5-89961    4/1993   Japan .
5-129080   5/1993   Japan .

Primary Examiner—Nimeshkumar D. Patel
Attorney, Agent, or Firm—Frishauf, Holtz, Goodman, Langer & Chick, P.C.

[57] ABSTRACT

A method of encapsulation for an organic EL device, which overcomes the difficulty of conventional methods by fully preventing the growth of dark spots in the organic EL device by providing an inert liquid layer having a dissolved oxygen concentration of 1 ppm or less on the periphery of the organic EL device.

20 Claims, 2 Drawing Sheets

METHOD OF ENCAPSULATING ORGANIC ELECTROLUMINESCENCE DEVICE AND ORGANIC ELECTROLUMINESCENCE DEVICE

TECHNICAL FIELD

The present invention relates to a method of encapsulating an organic electroluminescence device ("electroluminescence" to be referred to as "EL" hereinafter) and an encapsulated organic electroluminescence device (to be referred to as "encapsulateded EL device" hereinafter).

TECHNICAL BACKGROUND

An EL device has high visibility owing to self-emission of light, and has excellent impact resistance owing to a complete solid device. Due to these characteristics, there have been proposed a variety of inorganic EL devices for which inorganic compounds are adapted as a light-emitting material and a variety of organic EL devices for which organic compounds are adapted as a light-emitting material. Above all, developments of organic EL devices are actively underway for obtaining organic EL devices having higher performance, since the organic EL devices permit a decrease in drive voltage to a great extent as compared with inorganic EL devices.

In the basic constitution of an organic EL device, the organic EL device has a structure in which an anode, a light-emitting layer and a cathode are consecutively laminated, and the above organic EL device is formed on a substrate in many cases. The anode and the cathode may be reversed in position. In some cases, further, a hole-transporting layer is provided between the anode and the light-emitting layer, and an electron-injecting layer is provided between the cathode and the light-emitting layer, for improving the performance. The light-emitting layer is generally formed of one or a plurality of organic light-emitting materials, while it is sometimes formed of a mixture of an organic light-emitting material with a hole-transporting material and/or an electron-injecting material.

Further, in a pair of electrodes (anode and cathode) constituting the organic EL device, the electrode positioned on a surface through which light comes out is formed of a transparent or semi-transparent film for improving the light emission efficiency and due to a constitution as a surface light-emitting device. The other electrode (to be sometimes referred to as "opposite electrode" hereinafter) positioned opposite to the surface through which light comes out is formed of a specific metal thin film (thin film of metal, alloy or a mixture of metals).

The organic EL device having the above constitution is a current-driven light-emitting device, and it is required to apply a high electric current between the anode and the cathode for performing light emission. As a result, the device generates heat when the device is emitted, and when the device has oxygen or water around it, the oxygen and the water promote the oxidation of materials forming the device to degrade the device. In the typical degradation of the device by the oxidation and water, a dark spot occurs and grows. The dark spot refers to a fault point of light emission. As the oxidation of the materials forming the device proceeds with the driving of the organic EL device, the existing dark spot grows, and eventually, the dark spot spreads over the entirety of the light-emitting surface.

For preventing the above degradation, a variety of methods have been hitherto proposed. For example, for effectively removing heat which the device generates when the device is emitted, JP-A-4-363890 discloses a method in which an organic EL device is held in an inert liquid compound of liquid fluorinated carbon. As a method of removing water which is one of those which cause the degradation, JP-A-5-41281 discloses a method in which an organic EL device is held in an inert liquid compound prepared by incorporating a dehydrating agent such as synthetic zeolite into liquid fluorinated carbon (specifically, the same as the liquid fluorinated carbon disclosed in the above JP-A-4-363890). Further, JP-A-5-114486 discloses a method in which a heat-radiating layer encapsulating a fluorocarbon oil (specifically, included in the liquid fluorinated carbon disclosed in the above JP-A-4-363890) is formed on at least one of the anode and the cathode and heat generated at a time of driving the device is radiated through the heat-radiating layer to extend the light emission life of the device.

The degradation caused by water takes place in an inorganic EL device as well. As a method of preventing the degradation of the inorganic EL device, there is a method in which an inorganic EL device is encapsulated between a pair of glass substrates while providing a predetermined space and the space is charged with a protective liquid. U.S. Pat. No. 4,446,399 discloses a method in which silicone oil or silicone grease is used as the above protective liquid. U.S. Pat. No. 4,810,931 discloses a method in which a liquid obtained by degassing a perfluorinated inert liquid (specifically, the same as, or similar to, the liquid fluorinated carbon disclosed in the above JP-A-4-363890) under conditions of a liquid temperature of approximately 90 to 120° C. and an ambient pressure of about 10 Torr is used as the above protective liquid.

However, the occurrence and the growth of a dark spot in an organic EL device cannot be fully prevented even if the above conventional methods on the organic EL device are relied upon. The reason therefor is assumed to be as follows.

For preventing the occurrence and the growth of the dark spot, it is one of useful means to utilize liquid fluorinated carbon for removing the heat which the organic EL device generates when the device is emitted or to use a dehydrating agent for removing water which infiltrates the organic EL device during or after the organic EL device is encapsulated. However, studies by the present inventors show that the liquid fluorinated carbon and the fluorocarbon oil greatly dissolve gases, and not water which externally infiltrates but oxygen dissolved in the liquid fluorinated carbon or the fluorocarbon oil has a great influence on the occurrence and the growth of the dark spot. For example, perfluoroamine (Fluorinert (trade name), supplied by Sumitomo-3M Co., Ltd.) contains dissolved air in a maximum amount of 22 milliliters per 100 milliliters thereof (dissolved oxygen concentration 63 ppm). It is therefore difficult to fully prevent the occurrence and the growth of the dark spot by the above-described conventional methods on the organic EL device.

On the other hand, when the method of using a silicone oil or silicone grease as a protective liquid, among the above conventional methods on an inorganic EL device, is applied to the organic EL device, there is caused a problem that the organic EL device is degraded or broken by the silicone oil or the silicone grease. Further, when the method of using, as a protective liquid, a perfluorinated inert liquid which is degassed under the above-specified conditions is applied, it is difficult to fully prevent the occurrence and the growth of the dark spot in the organic EL device.

It is an object of the present invention to provide a method of encapsulating an organic EL device, in which the growth of the dark spot in the organic EL device can be firmly prevented, and an encapsulated organic EL device in which the growth of a dark spot is well prevented.

DISCLOSURE OF THE INVENTION

The method of encapsulating an organic EL device in the present invention, which achieves the above object, has a characteristic feature in that an inert liquid layer having a dissolved oxygen concentration of 1 ppm or less is provided on the periphery of an organic EL device formed by laminating an anode and a cathode through at least a light-emitting layer.

Further, the encapsulated organic EL device of the present invention, which achieves the above object, has a characteristic feature in that the encapsulated organic EL device has an organic EL device and an inert liquid layer which is provided on the periphery of the organic EL device and has a dissolved oxygen concentration of 1 ppm or less.

PREFERRED EMBODIMENTS OF THE INVENTION

First, the method of encapsulating an organic EL device in the present invention will be explained. In this method, an inert liquid layer having a dissolved oxygen concentration of 1 ppm or less is provided on the periphery of an organic EL device as described above. The reason for the limitation of the above dissolved oxygen concentration of the inert liquid layer to 1 ppm or less is that it is difficult to firmly prevent the growth of a dark spot when the dissolved oxygen concentration of the inert liquid layer exceeds 1 ppm. The lower the dissolved oxygen concentration is, the more desired it is. In a practical sense, however, the dissolved oxygen concentration is preferably in the range of from 0.01 to 1 ppm, particularly preferably 0.1 ppm or less.

The term "inert liquid" in the present invention refers to a chemically and physically stable liquid, and for example, it means a liquid which has stability and undergoes neither a chemical reaction nor dissolution when brought into contact with other substance. Specific examples of the inert liquid include liquid fluorinated carbons such as perfluoroalkanes, perfluoroamines and perfluoropolyethers. The liquid fluorinated carbons are particularly suitable inert liquids, since they have advantages that (1) they are excellent in electrical insulation (for example, Demnum S-20 shown in Table 1 to be described later shows a breakdown voltage of 72 kV when a sample has a thickness of 2.5 mm), that (2) they have the property of being dissolved in neither water nor oil, so that they substantially do not dissolve any layers forming an organic EL device, and that (3) they have low wettability to the surface of a metal and glass so that they substantially do not cause the peeling of an electrode by infiltrating a gap between a substrate surface and the electrode present directly thereon (electrode constituting an organic EL device) when the organic EL device is formed on a substrate.

The above liquid fluorinated carbons are commercially available. Since, however, the dissolved oxygen concentration of the inert liquid used in the present invention is limited to 1 ppm or less and since the commercially available liquid fluorinated carbons have a dissolved oxygen concentration of far greater than 1 ppm, they cannot be used in the method of the present invention as they are. When those inert liquids have a dissolved oxygen concentration of greater than 1 ppm, they are therefore used in the method of the present invention after the dissolved oxygen concentration thereof is decreased to 1 ppm or less by a ordinary temperature vacuum degassing method, a freeze vacuum degassing method or an inert gas replacement method. The method of decreasing the dissolved oxygen concentration is properly selected depending upon the kind of the inert liquid to be used.

For example, most of perfluoroalkanes and perfluoroamines have a vapor pressure of over $10^{-2}$ Torr at 25° C. When attempts are made to carry out an ordinary temperature vacuum degassing method with regard to those having a vapor pressure of over $10^{-2}$ Torr at 25° C., the vacuum degree cannot be increased to the vapor pressure or less, ard the evaporation thereof easily proceeds at room temperature, so that it is very difficult to decrease the dissolved oxygen concentration by the ordinary temperature vacuum degassing method. With regard to those having a vapor pressure of over $10^{-2}$ Torr at 25° C., it is therefore preferred to decrease the dissolved oxygen concentration by a freeze vacuum degassing method or an inert gas replacement method.

When the dissolved oxygen concentration is decreased by a freeze vacuum degassing method, for example, a series of operations including the step of freezing a degassing object (inert liquid whose dissolved oxygen concentration is to be decreased) to be degassed with liquid nitrogen, or the like, the step of vacuuming the degassing object in a frozen state at $10^{-2}$ Torr or less and the step of melting the degassing object in a frozen state after the vacuuming are carried out as many times as desired until the degassing object has a dissolved oxygen concentration of 1 ppm or less. When the degassing object is selected from Fluorinert FC-72, Fluorinert FC-84, Fluorinert FC-77 and Fluorinert FC-75 (all of these are trade names and included in perfluoroalkanes) supplied by Sumitomo-3M Co., Ltd. and Fluorinert FC-40, Fluorinert FC-43 and Fluorinert FC-70 (all of these are trade names and included in perfluoroamines) supplied by the same Company as above, a series of the above operations are repeated at least five times, whereby an intended material can be obtained. When the dissolved oxygen concentration is decreased by an inert gas replacement method, for example, 0.1 to 1 liter/minute, per 50 cc of a degassing object, of an inert gas (argon gas, nitrogen gas, helium gas, neon gas, or the like) is fed to the degassing object to cause a bubbling approximately for 4 to 8 hours until the dissolved oxygen concentration of the degassing object is 1 ppm or less. Of the above two methods, the free vacuum degassing method is preferred in that the dissolved oxygen concentration can be decreased within a relatively small period of time.

On the other hand, most of perfluoropolyethers have a vapor pressure of $10^{-2}$ Torr or less at 25° C. With regard to those having a vapor pressure of $10^{-2}$ Torr or less at 25° C., the dissolved oxygen concentration can be decreased by a ordinary temperature vacuum degassing method as well as by the vacuum freeze degassing method or the ine--t gas replacement method since they have a low vapor pressure at room temperature and show a small evaporation amount at room temperature.

When the dissolved oxygen concentration of an inert liquid having a vapor pressure of $10^{-2}$ Torr or less at 25° C. is decreased by the ordinary temperature vacuum degassing method, for example, a degassing object held at 160° C. or lower is subjected to vacuuming at $10^{-2}$ Torr or less until the dissolved oxygen concentration of the degassing object is 1 ppm or less. When the degassing object has a kinetic viscosity of 65 cSt or less at the time of degassing operation, dissolved oxygen can be relatively easily degassed. When the degassing object has a high kinetic viscosity at the time of degassing operation, oxygen and water are firmly stuck among molecules, and sufficient degassing is difficult. It is therefore preferred to decrease the kinetic viscosity of the degassing object by heating, or the like. In this case, however, the degassing operation is complicated. At a degassing time, the degassing object may be stirred and/or a zeolite may be introduced into the degassing object as required. When the zeolite is used, the zeolite is preferably selected from those formed of porous materials such as a biscuit, glass and polytetrafluoroethylene (Teflon). When the intended object is obtained by the ordinary temperature vacuum degassing method, the time required for the degassing operation is approximately for 0.1 to 2 hours so long as the degassing object has a kinetic viscosity of 65 cSt or less at the time of the degassing operation.

Further, when the dissolved oxygen concentration of an inert liquid having a vapor pressure of $10^{-2}$ Torr or less at 25° C. is decreased by the freeze vacuum degassing method or the inert gas replacement method, the degassing is carried out in the same manner as in the procedures used for an inert liquid having a vapor pressure of over $10^{-2}$ Torr at 25° C.

With regard to inert liquids having a vapor pressure of $10^{-2}$ Torr or less at 25° C., the dissolved oxygen concentration is preferably decreased by the ordinary temperature vacuum degassing method out of the above three methods, since the dissolved oxygen concentration can be decreased by the operation for a shorter period of time and since the degassing operation is simple.

Specific examples of inert liquid, from which inert liquids having a dissolved oxygen concentration of 1 ppm or less can be easily obtained by the ordinary temperature vacuum degassing method include various perfluoropolyethers as shown in the following Table 1.

TABLE 1

| Trade Name | Manufacturer | Vapor pressure (Torr) at 25° C. | Kinetic viscosity (cSt) at 25° C. |
|---|---|---|---|
| Demnum S-20 | Daikin Industries Ltd. | $10^{-6}$ | 53 |
| Fomblin Z03 | Montecatini | $10^{-4}$ | 30 |
| Fomblin M03 | Montecatini | — | 30 |
| Fomblin Y04 | Montecatini | — | 38 |
| Fomblin Y06 | Montecatini | — | 60 |
| Fomblin YLVAC06/06 | Montecatini | $10^{-6}$ | 62 |
| Fomblin Z DEAL | Montecatini | $10^{-4}$ | 20 |
| Fomblin Z DIAC | Montecatini | $10^{-5}$ | 60 |
| Galden HT250 | Montecatini | $10^{-2}$ | 10 |
| Galden HT270 | Montecatini | $10^{-2}$ | 20 |

Demnum S-20 in the above Table 1 has an average molecular weight of 2,700, a breakdown voltage of 72 kV as sample having a thickness of 2.5 mm and a volume resistivity of $10^{13}$ Ωcm at about 20° C. or lower. The structural formula thereof is represented by the following formula (1).

Average molecular weight 2,700

Further, the structural formula of Fomblin Z03 in Table 1 is represented by the following formula (2).

Average molecular weight 4,000

The structural formula of Galden H250 in Table 1 is represented by the following formula (3).

Average molecular weight 1,320

In the method of the present invention, the above inert liquid is used to form an inert liquid layer having a dissolved oxygen concentration of 1 ppm or less on the periphery of an organic EL device. The above inert liquid is particularly preferably an inert liquid of which not only the dissolved oxygen concentration is decreased to 1 ppm or less but also the water content is decreased to 10 ppm or less. When the dissolved oxygen concentration of the inert liquid is decreased to 1 ppm or less by the ordinary temperature vacuum degassing method, the dissolved oxygen concentration is decreased to 1 ppm or less by this method and at the same time, the degassing operation is further repeated, whereby an inert liquid having a dissolved oxygen concentration of 1 ppm or less and a water content of 10 ppm or less can be obtained. When the dissolved oxygen concentration of the inert liquid is decreased to 1 ppm or less by the inert gas replacement method, the dissolved oxygen concentration is decreased to 1 ppm or less by this method, and at the same, the bubbling is carried out for a little longer period of time, whereby an inert liquid having a dissolved oxygen concentration of 1 ppm or less and a water content of 10 ppm or less can be obtained. And, when the dissolved oxygen concentration of the inert liquid is decreased to 1 ppm or less by the freeze vacuum degassing method, the inert liquid is distilled under vacuum to obtain a first cut, a main cut and a last cut before or after the dissolved oxygen concentration is decreased to 1 ppm or less by this method, and the first cut and the last cut are removed, whereby an inert liquid having a dissolved oxygen concentration of 1 ppm or less and a water content of 10 ppm or less can be obtained. When an inert liquid having a dissolved oxygen concentration of 1 ppm or less and a water content of 10 ppm or less is used, the growth of a dark spot can be more firmly prevented.

When the above inert liquid layer is provided on the periphery of an organic EL device, the organic EL device as a whole may be immersed in the inert liquid filled in a container to form the inert liquid layer on the periphery of the above organic EL device. However, when the organic EL device is formed on a substrate, the inert liquid layer is preferably formed as follows. That is, the inert liquid layer is preferably formed by providing a housing material, which is to cover the organic EL device in combination with the above substrate while forming a space between the organic EL device and the housing material, outside the organic EL device formed on the substrate, and filling the inert liquid in the space formed by the above substrate and the above housing material. The filling of the inert liquid is carried out by injecting the inert liquid into the space through an inlet which is formed in the housing material or the substrate in advance, and the above inlet is closed after the injection of the inert liquid.

In the above case, the above housing material is a cap-shaped, plate-shaped (e.g., counterbored substrate), sheet-shaped or film-shaped material having a concave portion having an inner dimension greater than the outer dimension of the organic EL device which is to be encapsulated. The housing material is fixed onto the substrate such that it forms a substantially closed space in combination with the above substrate. In this case, the organic EL device as an encapsulating object is in a state in which it is encased in the above concave portion. When a plurality of organic EL devices are formed on a substrate, a plurality of the housing materials may be provided such that one housing material corresponds to one organic EL device, or the above housing material as one common sheet may be provided such that it corresponds to all of the organic EL devices. Further, a plurality of the above housing materials may be provided such that each housing material corresponds to a plurality of the organic EL devices as part of all of the organic EL devices. Similarly, concerning the above concave portion formed in the housing material, concave portions may be provided such that one concave portion corresponds to one organic EL device, the above concave portion may be provided such that it has a size sufficient to encase all the organic EL devices, or a plurality of the concave portions may be provided such that each concave portion can encase a plurality of the organic EL devices as part of all of the organic EL devices.

The housing material can be fixed onto the substrate with any one of various adhesives such as epoxy-resin-containing adhesives and acrylate-resin-containing adhesives. Specifically, those which difficultly permeate water and oxygen are preferable. As examples, there is ARALDITE AR-R30 (trade name of epoxy resin adhesive, supplied by Ciba Geigy). Further, there are a variety of resins such as thermosetting resins and photo-curable resins which can be used as a substitute for the above adhesive.

The material of the housing material is preferably an electrically insulating substance such as a glass and a polymer. Specific examples thereof include soda lime glass, borosilicate glass, silicate glass, silica glass, fluorescence-free glass, quartz, an acrylic resin, a styrene resin, a polycarbonate resin, an epoxy resin, polyethylene, polyester and a silicone resin. Further, when the organic EL device as an encapsulating object has insulation-coated lead wires as lead wires from the electrodes or when the housing material is fixed onto the substrate with an electrically insulating adhesive or an electrically insulating resin, the housing material may be formed of an electrically conductive material such as stainless steel or aluminum alloy.

When the inert liquid layer is formed by charging the inert liquid into the space formed between the above substrate on which the organic EL device is formed and the above housing material, the inert liquid may be injected into the above space in the atmosphere, while it is preferred to inject the inert liquid into the above space in a nitrogen gas atmosphere or an argon gas atmosphere for preventing the dissolving of oxygen and water in the inert Liquid at the time of the injection operation. Further, the charging may be carried out by a so-called vacuum injection method.

The above term "vacuum injection method" refers to a method in which a space to which a liquid to be injected ("injectant" hereinafter) is to be injected is maintained in a degassed state and the injectant is injected to the space in the above state or a method in which the space to which the injectant is to be injected is degassed and the injectant is injected into the space by utilizing a difference between the pressure of the space and the pressure of an atmosphere surrounding a feed source of the injectant (the former has a lower pressure). Specifically, there are the following methods (i) to (iii) below.

(i) An object (the entirety of an object having a space into which the injectant is to be injected) is immersed in a vessel containing the injectant, and in this sate, heating and pressure reduction are carried out to degass the above space and the injectant is injected (see JP-B-57-47559, column 6, lines 13 to 18).

(ii) A container (feed source of the injectant) containing the injectant and an object (the entirety of an object having a space into which the injectant is to be injected) are placed in a vacuum chamber, and the pressure in the vacuum chamber is reduced. Then, a flow is formed between the above space and the feed source of the injectant with a tube, and then the system as a whole is exposed to atmosphere to inject the injectant into the object by utilizing atmospheric pressure (see JP-B-57-47559, column 7, lines 15 to 26).

(iii) An object (the entirety of an object having a space into which the injectant is to be injected) is placed in an uncovered container, the container with the object in it is placed in a vacuum container, and the pressure in the vacuum container is reduced. In this case, the object is placed such that the injectant inlet provided to the above object is positioned close to the bottom of the above uncovered container. Then, the injectant is introduced into the above uncovered container from outside the above vacuum container, and the injectant is charged into the container until the above inlet is fully covered with the injectant. Thereafter, dry gas is introduced into the vacuum container to bring back the pressure in the vacuum container to atmospheric pressure, and the injectant is injected into the above space by utilizing a difference between the pressure (atmospheric pressure) of an atmosphere surrounding the injectant contained in the above container and the pressure in the space to which the injectant is to be injected (see JP-A-64-57590, page 2, left bottom column, line 4 to page 3, left top column, line 9).

When the inert liquid is injected, the inert liquid may be heated to increase its flowability regardless of its injection methods.

The closing of the inlet after the injection of the injectant is preferably carried out in an inert gas atmosphere such as nitrogen gas atmosphere or argon gas atmosphere rather than it is carried out in the atmosphere. The inlet can be closed with one of the above adhesives or the above resins which are described as one used for fixing the housing material to the substrate.

The encapsulating as an object of the present invention can be carried out by forming an inert liquid layer having a dissolved oxygen concentration of 1 ppm or less on the periphery of an organic EL device as described above. At the same time, the encapsulated organic EL device as an object of the present invention can be also obtained. In this case, when the above inert liquid layer is formed from the inert liquid containing an adsorbent, the encapsulation can be carried out more effectively, and there can be obtained an encapsulated organic EL device which is more effectively encapsulated.

The above adsorbent works to prevent the infiltration of oxygen and water into an organic EL device from outside when or after the organic EL device is encapsulated. The adsorbent is not specially limited so long as it adsorbs oxygen and water, while there is preferred an adsorbent which has the properties of adsorbing them in a large amount and sparingly releasing oxygen and water which are once adsorbed. The adsorbent is not specially limited in form, while an adsorbent having the form of a powder is preferred due to its large adsorption area.

Specific examples of the above adsorbent include (1) an inorganic compound selected from activated alumina, diatomaceous earth, activated carbon, hemi-hydrated gypsum, phosphorus pentoxide, magnesium perchlorate, potassium hydroxide, calcium sulfate, calcium bromide, calcium oxide, zinc chloride, zinc bromide or anhydrous copper sulfate, (2) a metal selected from the metal group consisting of lithium, beryllium, potassium, sodium, magnesium, rubidium, strontium and calcium, (3) an alloy of metals selected from the above metal group, and (4) an acrylic water-absorption polymer or a methacrylic water-absorption polymer. The above adsorbents may be used alone or in combination of at least two of them.

The adsorbent is preferably used in a state in which it has sufficient capability of adsorption. For this reason, it is preferred to remove oxygen and water adsorbed to the adsorbent before use (the treatment for removing oxygen and water adsorbed to the adsorbent will be referred to as "activation treatment" hereinafter). Although differing depending upon the kind of the adsorbent, the activation treatment of the adsorbent can be carried out by a method in which the adsorbent is heated, the adsorbent is subjected to vacuuming, the adsorbent is allowed to stand in an inert gas current or the surface of the adsorbent is cut and removed or by a method combining at least two of these methods.

The activation treatment of the adsorbent is preferably carried out while the adsorbent is isolated from the atmosphere. Further, the activation-treated adsorbent is also preferably kept isolated from the atmosphere until it is used for forming the intended inert liquid layer (layer containing the adsorbent) in order to prevent a decrease in the activity thereof. For example, preferably, the activation treatment by heating or vacuuming is carried out in a state in which the adsorbent is placed in a container capable of blocking off the atmosphere, such as a container with a vacuum valve, the valve is closed after the activation treatment is completed, and the activation-treated adsorbent is stored in a state in which the atmosphere is blocked off, until it is used.

The amount of the adsorbent can be selected as required depending upon the kind of the adsorbent. Generally, the larger the amount of the adsorbent is, the higher the adsorption effect is. However, when the amount of the adsorbent is too large, (a) a mixture prepared by adding the adsorbent to the above inert liquid may show an extremely decreased fluidity, so that it is sometimes difficult to form the intended inert liquid layer (layer containing the adsorbent), and (b) the adsorbent may damage an organic EL device.

When an adsorbent having a small particle diameter is used to prepare the above mixture, the mixture shows a decreased fluidity than a mixture containing an adsorbent having the same weight but having a larger particle diameter, and as a result, it is more difficult to form the intended inert liquid layer (layer containing the adsorbent). However, the adsorbent having a small particle diameter shows a larger adsorption amount since it has a larger effective area than the adsorbent having a large particle diameter. It cannot therefore mean that an encapsulating effect is low when the amount (weight) of the adsorbent is small. Although depending upon the kind and the particle diameter of the adsorbent, the amount of the adsorbent is preferably in the range of approximately from 1 mg to 10 g per milliliter of the above inert liquid, more preferably in the range of approximately from 30 mg to 3 g per milliliter of the above inert liquid.

The inert liquid used for forming the intended inert liquid layer containing the adsorbent may be an inert liquid which has a dissolved oxygen concentration of more than 1 ppm before it contains the adsorbent and which shows a dissolved oxygen concentration of 1 ppm or less after it contains the adsorbent. For forming the inert liquid layer having a higher encapsulating effect, however, the inert liquid preferably has a dissolved oxygen concentration of 1 ppm or less before it contains the adsorbent. The inert liquid used in the above case is therefore preferably an inert liquid whose dissolved oxygen concentration is decreased to 1 ppm or less by the above ordinary temperature vacuum degassing method, freeze vacuum degassing method or inert gas replacement method.

When the inert liquid containing the adsorbent is used to form the inert liquid layer on the periphery of an organic EL device, the organic EL device as a whole may be immersed in the inert liquid (liquid containing the adsorbent) filled in a container to form the inert liquid layer on the periphery of the above organic EL device. However, when the organic EL device is formed on a substrate, the inert liquid layer is preferably formed by providing a housing material, which is to cover the organic EL device in combination with the above substrate while forming a space between the organic EL device and the housing material, outside the organic EL device formed on the substrate, and filling the inert liquid (liquid containing the adsorbent) in the space formed by the above substrate and the above housing material.

Specific examples of the method of providing the above inert liquid layer on the periphery of an organic EL device by utilizing a housing material include the following methods (A) and (B).

(A) A method in which the adsorbent and the inert liquid are mixed to prepare a mixture and the mixture is filled in the above space formed by the substrate on which the organic EL device is formed and the housing material which covers the organic EL device on the substrate, to form the intended inert liquid layer.

When the inert liquid layer is formed by the above method, the above mixture should not be prepared in the atmosphere, and it is preferred to prepare the above mixture in a dry inert gas atmosphere (nitrogen gas atmosphere or argon gas atmosphere), for example, in a gloved box in which the atmosphere is purged with a dry inert gas. When the mixture is prepared, the inert liquid (liquid containing no adsorbent) may be poured into a container in which the adsorbent is placed, or the adsorbent may be placed in a container containing the inert liquid (liquid containing no adsorbent). Further, a container for preparing the mixture may be prepared in addition to a container containing the adsorbent and a container containing the inert liquid (liquid containing no adsorbent), and the adsorbent and the inert liquid may be placed in the above container concurrently or separately. When the adsorbent and the inert liquid are separately placed in the container for preparing the mixture, any one of them may be placed first.

The intended inert liquid layer can be formed from the above mixture by charging the mixture into the above space through an inlet provided in advance in the above substrate on which the organic EL device is formed or the housing material covering the organic EL device on the substrate and closing the outlet after the charging. It is also preferred to form the inert liquid layer in a dry inert gas atmosphere.

The above method is suitable for forming the inert liquid layer from the mixture (inert liquid containing the adsorbent) having a high fluidity.

(B) A method in which the adsorbent and the inert liquid are separately charged into the above space formed by the substrate on which the organic EL device is formed and the housing material covering the organic EL device on the substrate, to form the intended inert liquid layer.

The above method can be further classified into the following three methods (b1) to (b3). In any one of these methods, it is preferred to form the inert liquid layer in an inert gas atmosphere.

(b1) The adsorbent is placed in a region within the above space on the organic EL device and on the substrate on which the organic EL device is formed, then, the housing material is provided on the substrate, and the inert liquid (liquid containing no adsorbent) is charged into the above space through an inlet provided in the above substrate or the above housing material in advance, thereby to form the intended inert liquid layer. The inlet is closed after the inert liquid (containing no adsorbent) is charged.

(b2) The adsorbent is placed in a concave portion which is present in the housing material and concerned in forming the above space, the housing material is provided on the substrate on which the organic EL device is formed, and then the inert liquid (liquid containing no adsorbent) is charged into the above space through an inlet provided in the above substrate or the above housing material in advance, thereby to form the intended inert liquid layer. The inlet is closed after the inert liquid (containing no adsorbent) is charged.

(b3) The housing material is provided on the substrate on which the organic EL device is formed, and the adsorbent and the inert liquid are charged into the above space through an inlet provided in the above substrate or the above housing material in advance one after the other, thereby to form the intended inert liquid layer. The inlet is closed after the adsorbent and the inert liquid (containing no adsorbent) are charged.

The organic EL device as an encapsulating object in the method of the present invention will be explained hereinafter.

The device constitution of the organic EL device as an encapsulating object in the present invention is not specially limited, and the object can include organic EL devices having various device constitutions. The constitution of the organic EL device in the present invention includes various device constitutions.

Specific examples of layer structure of the organic EL device in which light comes out through the substrate side include the following (1) to (4) as to the lamination order on the substrate surface.

(1) Anode/light-emitting layer/cathode
(2) Anode/light-emitting layer/electron-injecting layer/cathode
(3) Anode/hole-transporting layer/light-emitting layer/cathode
(4) Anode/hole-transporting layer/light-emitting layer/electron-injecting layer/cathode The above light-emitting layer is formed of one or a plurality of organic light-emitting materials, while it is sometimes formed of a mixture of an organic light-emitting material with a hole-transporting material and/or an electron-injecting material. In some cases, further, a protective layer is formed on the periphery of a device having the above layer structure to cover the device, for preventing the infiltration of water into the device.

The above organic EL device is generally formed by consecutively forming each layer including the anode and the cathode on a substrate, while the substrate is not used in some cases. When the substrate side is a surface through which light comes out (light-emitting surface) in an organic EL device formed on a substrate, the layers are consecutively laminated such that the anode is present immediately on the substrate. In this case, the substrate is formed of a substance which has a high transmittance (about 80% or more) to light emitted from the organic EL device (EL light), and specifically, it is selected from a plate-shaped substrate, a sheet-shaped substrate or a film-shaped substrate formed of transparent glass, transparent plastic or quartz.

As materials for the anode, the cathode, the light-emitting layer, the hole-transporting layer, electron-injecting layer and the protective layer, a variety of materials can be used for each. For example, the anode material is preferably selected from metals, alloys or electrically conductive compounds having a high work function (e.g., at least 4 eV) or mixtures of these. Specific examples thereof include metals such as gold and nickel and electrically conductive materials such as CuI, ITO, $SnO_2$ and ZnO. Although depending upon materials, the thickness of the anode can be generally set in the range of from 10 nm to 1 $\mu$m as required.

Further, the cathode material is preferably selected from metals, alloys or electrically conductive compounds having a low work function (e.g., 4 eV or less) or mixtures of these. Specific examples thereof include sodium, sodium-potassium alloy, magnesium, lithium, alloy and mixture of magnesium with silver, aluminum, $Al/Al_2O_3$, indium, and rare earth metals such as ytterbium. Although depending upon materials, the thickness of the cathode can be generally set in the range of from 10 nm to 1 $\mu$m as required.

In each of the anode and the cathode, the sheet resistance is preferably several hundreds $\Omega/\square$ or less. The size of the work function used as the standard for electing the anode material and the cathode material shall not be limited to 4 eV.

The material for the light-emitting layer (organic light-emitting material) can be selected from those which can form a light-emitting layer of an organic EL device, i.e., a layer having injection functions of being able to receive holes injected from the anode or the hole--transporting layer and at the same time being able to receive electrons injected from the cathode or the electron-injecting layer when an electric field is applied, transportation functions of moving injected charges (at least electrons or holes) under the force of an electric field, and light emission functions of providing a site where electrons and holes are recombined to emit light. Specific examples thereof include benzothiazole-, benzoimidazole- and benzooxazole-containing fluorescent whiteners, a metal chelated oxinoid compound, a stylylbenzene-containing compound, a distyrylpyrazine derivative, a polyphenyl-containing compound, 12-phthaloperinone, 1,4-diphenyl-1,3-butadiene, 1,1,4,4-tetraphenyl-1,3-butadiene, a naphthalimide derivative, a perylene derivative, an oxadiazole derivative, an aldazine derivative, a pyrazoline derivative, a cyclopentadiene derivative, a pyrrolopyrrole, derivative, a styrylamine derivative, a coumarine-containing compound, an aromatic dimethylidene compound and a metal complex of 8-quinolinol derivative. Although not specially limited, the thickness of the light-emitting layer is generally set in the range of from 5 nm to 5 μm as required.

The material for the hole-transporting layer (hole-transporting material) may be any material so long as it has one of the capability of transporting holes and the property of being barriers against electrons. Specific examples thereof include a triazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, an oxazole derivative, styrylanthracene derivative, a fluorenone derivative, a hydrazone derivative, a stilbene derivative, a silazane derivative, a polysilane-containing compound, an aniline-containing compound, electrically conductive oligomers having a high molecular weight such as a thiophene oligomer, a porphyrin compound, an aromatic tertiary amine compound, a styrylamine compound and an aromatic dimethylidene-containing compound. The thickness of the hole-transporting layer is not specially limited, either, while it is generally set in the range of 5 nm to 5 μm as required. The hole-transporting layer may have the structure of a monolayer formed of one or at least two of the above materials, or it may have the structure of a plurality of layers each of which is formed of the same material or different materials.

The electron-injecting layer may be any layer so long as it has the function of transferring electrons injected from the cathode to the light-emitting layer. Specific examples of the material therefor (electron-injecting maternal) include heterocyclic tetracarboxylic acid anhydrides such as a nitro-substituted fluorenone derivative, an anthraquinodimethane derivative, a diphenylquinone derivative, a thiopyran dioxide derivative and a naphthaleneperylene, carbodiimide, a fluorenylidenemethane derivative, an anthraquinodimethane derivative, an anthrone derivative, an oxadiazole derivative, a metal complex of 8-quinolinol derivative, metal-free phthalocyanine, metal phthalocyanine, compounds formed by replacing the terminal of these compounds with an alkyl group or a sulfone group, and a distyrylpyrazine derivative. The thickness of the electron-injecting layer is not specially limited, either, while it is generally set in the range of from 5 nm to 5 μm as required. The electron-injecting layer may have the structure of a monolayer formed of one or at least two of the above materials, or it may have the structure of a plurality of layers each of which is formed of the same material or different materials.

The metal complex of 8-quinolinol derivative can be used as a material for the light-emitting layer and as a material for the electron-injecting layer as described above. Specific examples of the metal complex of 8-quinolinol derivative include tris(8-quinolinol)aluminum, bis(8-quinolinol) magnesium, bis(benzo-8-quinolinol)zinc, bis(2-methyl-8-quinolate aluminum oxide, tris (8-quinolinol) indium, tris (5-methyl-8-quinolinol)aluminum, 8-quinolinollithium, tris (5-chloro-8-quinolinol)gallium, bis(5-chloro-8-quinolinol) calcium, tris(5,7-dichloro-8-quinolinol)aluminum, tris(5,7-dibromo-8-hydroxyquinolinol)aluminum, bis(8-quinolinol) beryllium, bis(2-methyl-8-quinolinol)beryllium, bis(8-quinolinol) zinc, bis(2-methyl-8-quinolinol)zinc, bis(8-quinolinol)tin, and tris(7-propyl-8-quinolinol)aluminum.

Specific examples of the material for the protective layer include a copolymer obtained by copolymerizing a monomer mixture containing tetrafluoroethylene and at least one comonomer, a fluorine-containing copolymer of which the copolymer main chain contains a cyclic structure, polyethylene, polypropylene, polymethyl methacrylate, polyimide, polyurea, polytetrafluoroethylene, polychlorotrifluoroethylene, polydichlorodifluoroethylene, a copolymer from chlorotrifluoroethylene and dichlorodifluoroethylene, a water-absorption substance having a water absoprtion ratio of at least 1%, a humidity-preventive substance having a water absorption ratio of 0.1% or less, metals such as In, Sn, Pb, Au, Cu, Ag, Al, Ti and Ni, metal oxides such as MgO, SiO, $SiO_2$, $Al_2O_3$, GeO, NiO, CaO, BaO, $Fe_2O_3$, $Y_2O_3$ and $TiO_2$, and metal fluorides such as $MgF_2$, LiF, $AlF_3$ and $CaF_2$.

Further, the methods of forming the layers (including the anode and the cathode) which constitute the organic EL device as an encapsulating object are not specially limited. As methods of forming the anode, the cathode, the light-emitting layer, the hole-transporting layer and the electron-injecting layer, for example, a vacuum deposition method, a spin coating method, a casting method, a sputtering method and an LB method may be applied. For forming the light-emitting layer, however, it is preferred to apply any method (a vacuum deposition method, a spin coating method, a casting method or an LB method) other than the sputtering method. The light-emitting layer is particularly preferably a molecule-deposited film. The term "molecule-deposited film" refers to a thin film formed by deposition from a material compound in a gaseous state or a film formed by solidifying a material compound which is in a solution or liquid state. Generally, the above molecule-deposited film is distinguishable from a thin film formed by an LB method (molecule-accumulated film) on the basis of differences in cohesive structure and high-order structure and functional differences caused by them. When the light-emitting layer is formed by a spin coating method, a coating solution is prepared by dissolving a binder such as a resin and a material compound in a solvent.

The protective layer can be formed by any one of a vacuum deposition method, a spin coating method, a sputtering method, a casting method, an MBE (molecular beam epitaxy) method, a cluster ion beam method, an ion plating method, a plasma polymerization method (high-frequency exited ion plating method), a reactive sputtering method, a plasma CVD method, a laser CVD method, a heat CVD method and a gas source CVD method.

The method of forming each layer can be changed as required depending upon materials used. When the vacuum deposition method is used for forming each layer which constitutes the organic EL device, the organic EL device can be formed by the vacuum deposition method alone, which is advantageous for simplifying facilities and decreasing the production time.

In the encapsulated organic EL device of the present invention, obtained by providing the above inert liquid layer on the periphery of an organic EL device as an encapsulating object, the presence of the inert liquid layer firmly prevents the occurrence of a dark spot and the growth of a dark spot, and the device therefore has a longer life.

The present invention will be further explained by contrasting Examples and Comparative Examples hereinafter, while the present invention shall not be limited to the following Examples. The method of preparing organic EL devices used as encapsulating objects in Examples and Comparative Examples will be explained first.

When an organic EL device as an encapsulating object was produced, a transparent substrate obtained by forming an ITO film having a thickness of 100 nm on a 25 mm×75 mm×1.1 mm glass substrate was provided first. The substrate was measured for a light transmittance with UV-3100PC supplied by Shimadzu Corporation, to show about 80% in a wavelength region of 400 to 600 nm. The substrate was ultrasonically washed in isopropyl alcohol for 5 minutes and in pure water for 5 minutes, and the washed substrate was further UV-ozone-cleaned with an apparatus supplied by SAMCO International Laboratories.

Then, the substrate was fixed to a substrate holder in a commercially available vapor deposition apparatus (supplied by ULVAC Japan, Ltd.), and 200 mg of N,N'-bis (3-methylphenyl-N,N'-diphenyl[1,1'-biphenyl]-4,4'-diamine (to be abbreviated as "TPD" hereinafter) was placed in a resistance heating boat formed of molybdenum. Further, 200 mg of 4,4'-bis(2,2'-diphenylvinyl)biphenyl (to be abbreviated as "DPVBi" hereinafter) was placed in another resistance heating boat formed of molybdenum, and then the vacuum chamber was pressure-decreased to $1\times10^{-4}$ Pa.

Then, the boat with TPD in it was heated to 215 to 220° C. to deposit TPD on the above ITO film at a deposition rate of 0.1 to 0.3 nm/s and to form a hole-transporting layer having a thickness of 60 nm. In this case, the substrate had a temperature of room temperature. While the above-obtained product was allowed to remain in the vacuum chamber after the formation of the hole-transporting layer, the above-the boat with DPVBi in it was heated up to 240° C. to deposit DPVBi on the hole-transporting layer at a deposition rate of 0.1 to 0.3 nm/s to form a light-emitting layer having a thickness of 40 nm. In this case, the substrate also had a temperature of room temperature.

The above-obtained product was taken out of the vacuum chamber, a mask formed of stainless steel was placed on the above light-emitting layer, and the resultant set was again fixed to the substrate holder. Then, 200 mg of tris(8-quinolinol)aluminum (to be abbreviated as "$Alq_3$" hereinafter) was placed in one boat formed of molybdenum, and 1 g of a magnesium ribbon was placed in the other boat formed of molybdenum. Further, 500 mg of a silver wire was placed in a basket formed of tungsten, and these boats were set in the vacuum chamber.

Then, the vacuum chamber was pressure-decreased to $1\times10^{-4}$ Pa, and thereafter, the boat with $Alq_3$ in it was heated up to 230° C. to deposit $Alq_3$ on the above light-emitting layer at a deposition rate of 0.01 to 0.03 nm/s and to form an electron-injecting layer having a thickness of 20 nm. Further, the silver was deposited on the above electron-injecting layer at a deposition rate of 0.1 nm/s, and at the same time, the magnesium was deposited on the above electron-injecting layer at a deposition rate of 1.4 nm/s, to form an opposite electrode having a thickness of 150 nm and being formed of mixed metals of magnesium and silver. The opposite electrode was measured for a reflectance with UV-3100PC supplied by Shimadzu Corporation to show 80% in the wavelength region of 400 to 600 nm.

The opposite electrode was finally formed as described above, to give an organic EL device as an encapsulating object. The organic EL device was a device in which an ITO film as an anode, a TPD layer as a hole-transporting layer, a DPVBi layer as a light-emitting layer, an $Alq_3$ layer as an electron-injecting layer and a layer of magnesium-silver mixed metals as an opposite electrode (cathode) were consecutively laminated on one main surface of the glass substrate. Part of the ITO film and part of the layer of magnesium-silver mixed metals worked as lead wires from the electrodes, and the light-emitting layer had a size of 6 mm×10 mm when viewed as a flat surface.

EXAMPLE 1

(1) Preparation of inert liquid having a dissolved oxygen concentration of 1 ppm or less As an inert liquid of which the dissolved oxygen concentration was not adjusted, there was provided perfluoropolyether (Demnum S-20 (trade name; vapor pressure at 25° C., $10^{-6}$ Torr; kinetic viscosity at 25° C., 53 cSt), supplied by Daikin Industries Ltd.) . A proper amount of the above DemnumS-20 was placed in a glass sample container with a vacuum valve, and the sample container and a vacuum pump with a diffusion pump (ULVAC VPC-050, supplied by ULVAC Japan, Ltd.) were connected to each other with a flange.

Then, a zeolite formed of polytetrafluoroethylene (Teflon) was inserted into the Demnum S-20 in the above sample container, and while the Demnum was stirred at room temperature, the sample container was vacuumed to $10^{-4}$ Torr to exhaust dissolved oxygen by a ordinary temperature vacuum degassing method for about 30 minutes until no foaming was found.

The above-prepared inert liquid had a dissolved oxygen concentration of 0.05 ppm and a water content of 5 ppm. The dissolved oxygen concentration was measured with SUD-1 (trade name of a measuring apparatus) supplied by Central Kagaku, Ltd. In a gloved box in which the atmosphere was purged with nitrogen gas, the inert liquid was flowed down a sensor portion of the above apparatus at a constant flow rate of 50 ml/minute, and when displayed values were stabilized after about 20 seconds, the measurement value was read. Further, the inert liquid was measured for a water content by a Karl Fischer's titration method.

(2) Encapsulation

First, there was provided a cap-shaped housing material formed of glass (counterbored substrate supplied by Howa Industries). The housing material had one concave portion having an inner dimension of 13 mm×13 mm×1 mm and had an outer dimension of 15 mm×15 mm×18 mm. Further, an inlet for charging the inert liquid was formed in the bottom of the concave portion of the housing material.

Then, the glass substrate on which the above organic EL device was formed and the above housing material were bonded to each other with an epoxy resin adhesive (ARALDITE AR-R30, supplied by Ciba Geigy) such that the organic EL device as an encapsulating object was placed within the above concave portion. In this case, the organic EL device was present in a space formed by the concave portion of the housing material and the substrate, and the organic EL device and the housing material were out of contact.

The resultant set was allowed to stand for 3 hours to cure the adhesive, and then the set was vacuum-dried with a vacuum desiccator. The vacuum-dried set was transferred into a gloved box in which the atmosphere was purged with nitrogen gas, and in the gloved box, the inert liquid prepared in the above (1) was charged into the space formed by the concave portion of the housing material and the substrate through the inlet formed in the housing material. In the gloved box, after the charging of the inert liquid, the above inlet was closed with an epoxy resin adhesive (ARALDITE AR-R30, supplied by Ciba Geigy), and the set was allowed to stand in the gloved box for about 3 hours until the adhesive was cured.

Figure 1:
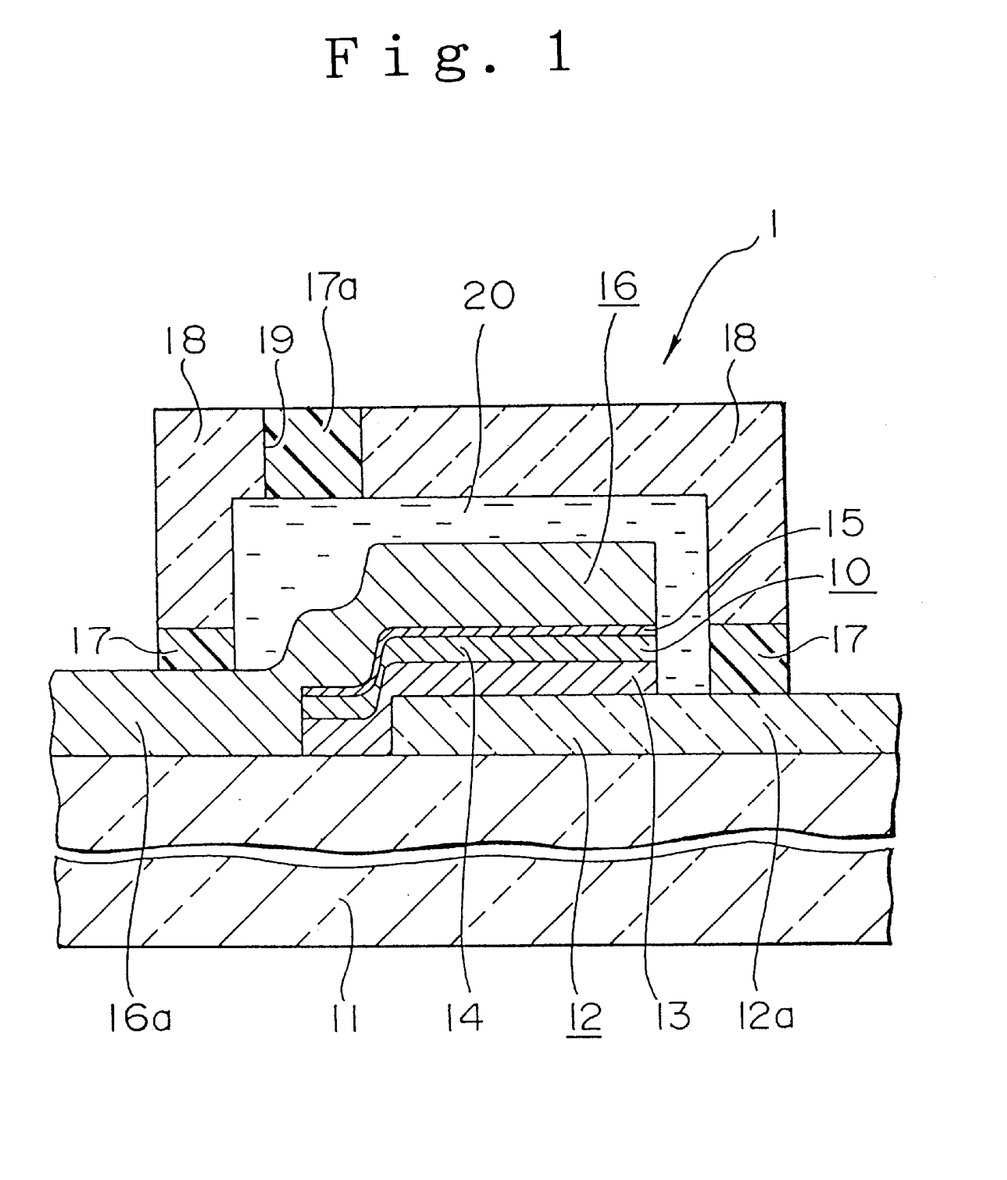
FIG. 1 is a schematic cross sectional view of an encapsulated organic EL device obtained in Example 1.

An inert liquid layer was formed on the periphery of the organic EL device as an encapsulating object by charging the inert liquid prepared in the above (1) into the space formed by the concave portion of the housing material and the substrate, whereby the encapsulating as an object was performed. At the same time, an encapsulated organic EL device as an object was obtained. FIG. 1 shows a schematic cross sectional view of the encapsulated organic EL device.

As shown in FIG. 1, the above-obtained encapsulated organic EL device 1 of the present invention has an inert liquid layer 20 of the inert liquid prepared in the above (1) formed on the periphery of an organic EL device 10 as an encapsulating object. The organic EL device 10 as an encapsulating object is formed by consecutively laminating an ITO film 12 as an anode, a TPD layer 13 as a hole-transporting layer, a DPVBi layer 14 as a light-emitting layer, an $Alq_3$ layer as an electron-injecting layer and a layer 16 of magnesium-silver mixed metals as an opposite electrode (cathode) on the a glass substrate 11. Part 12a of the ITO film 12 and part 16a of the layer 16 of magnesium-silver mixed metals constitute lead wires from the electrodes. The organic EL device 10 is present in a space formed by the concave portion of the housing material 18 fixed onto the glass substrate 11 with an epoxy resin adhesive 17 and the glass substrate 11, and the space was charged with the inert liquid prepared in the above (1). As a result, the inert liquid layer 20 is formed on the periphery of the organic EL device 10. The inert liquid is a liquid charged through an inlet 19 provided in the housing material 18, and the inlet 19 is closed with an epoxy resin adhesive 17a after the charging of the inert liquid.

(3) Evaluation of encapsulating effect

The encapsulated organic EL device obtained in the above (2) was connected to a direct-current constant-current electric source through the two lead wires of the organic EL device, and electricity was applied such that an initial brightness at 25° C. in the atmosphere was 100 cd/m². In this case, the current value was 0.56 mA, and the voltage value was 9 V. The brightness was measured with a luminance meter (trade name CS-100) supplied by Minolta Camera Cc., Ltd.

After the above electric application, an enlarged photograph of the light-emitting surface was taken (magnification, 10 times), and a ratio of the total area of dark spots viewed as a flat surface to the area of the light-emitting surface viewed as a flat surface (to be referred to as "no-light emission area ratio" hereinafter) was determined on the basis of the above photograph, to obtain 0.43%. Further, one dark spot was measured for a diameter to show 18.4 μm.

Further, 139 hours after the electric application was initiated, a no-light emission area ratio was determined in the same manner as above, and the same dark spot as that measured above was measured for a diameter. Further, the growth ratio of a dark spot was defined to be a diameter increment value per hour, and the value thereof was determined. Table 2 shows the results.

EXAMPLE 2

Ordinary temperature vacuum degassing was carried out under the same conditions as those in Example 1 (1) except that the inert liquid of which the dissolved oxygen concentration was not adjusted was replaced with perfluoropolyether (Fomblin Z03 (trade name; vapor pressure at 25° C., $10^{-4}$ Torr; kinetic viscosity at 25° C., 30 cSt) , supplied by Montecatini), to prepare a inert liquid having a dissolved oxygen concentration of 0.1 ppm and a water content of 5 ppm. Then, an encapsulating as an object was carried out under the same conditions as those in Example 1 except that the inert liquid used for forming an inert liquid layer on the periphery of an organic EL device was replaced with the above-prepared inert liquid. At the same time, an encapsulated organic EL device as an object was also obtained.

The above encapsulated organic EL device was evaluated for encapsulating effects in the same manner as in Example 1(3) except that the second calculation or measurement of a no-light emission area and a dark spDt diameter was conducted 152 hours after the initiation of electric application. Table 2 shows the results.

Comparative Example 1

Ordinary temperature vacuum degassing was carried out under the same conditions as those in Example 1 (1) except that the inert liquid of which the dissolved oxygen concentration was not adjusted was replaced with perfluoroamine (Fluorinert FC-70 (trade name; vapor pressure at 25° C., 0.1 Torr , supplied by Sumitomo-3M Co., Ltd.). However, the degassing was not fully performed since the above inert liquid had a higher vapor pressure than $10^{-2}$ Torr at 25° C., and the prepared inert liquid had a dissolved oxygen concentration of 2 ppm or outside the range limited in the present invention. Further, the inert liquid had a water content of 20 ppm. Further, an organic EL device was encapsulated under the same conditions as those in Example 1 except that the inert liquid used for forming an inert liquid layer on the periphery of the organic EL device was replaced with the above inert liquid, to give an encapsulated organic EL device.

The above encapsulated organic EL device was evaluated for encapsulating effects in the same manner as in Example 1 (3) except that the second calculation or measurement of a no-light emission area and a dark spot diameter was conducted 124 hours after the initiation of electric application. Table 2 shows the results.

Comparative Example 2

Ordinary temperature vacuum degassing was carried out under the same conditions as those in Example 1(1) except that the inert liquid of which the dissolved oxygen concentration was not adjusted was replaced with perfluoroamine (Fluorinert FC-43 (trade name; vapor pressure at 25° C., 1.3 Torr , supplied by Sumitomo-3M Co., Ltd.). However, the degassing was not fully performed since the above inert liquid had a higher vapor pressure than $10^{-2}$ Torr at 25° C., and the prepared inert liquid had a dissolved oxygen concentration of 10 ppm or outside the range limited in the present invention. Further, the inert liquid had a water content of 50 ppm. Further, an organic EL device was encapsulated under the same conditions as those in Example 1 except that the inert liquid used for forming an inert liquid layer on the periphery of the organic EL device was replaced with the above inert liquid, to give an encapsulated organic EL device.

The above encapsulated organic EL device was evaluated for encapsulating effects in the same manner as in Example 1(3) except that the second calculation or measurement of a no-light emission area and a dark spot diameter was conducted 136 hours after the initiation of electric application. Table 2 shows the results.

Comparative Example 3

An organic EL device was encapsulated under the same conditions as those in Example 1 except that an organic EL device as an encapsulating object was encapsulated under the same conditions as those in Example 1 except that the perfluoropolyether (Demnum S-20 (trade name), supplied by Daikin Industries Ltd.) which was vacuum-degassed in Example 1 was replaced with an inert liquid which was perfluoropolyether (Demnum S-20 (trade name), supplied by Daikin Industries Ltd.) not vacuum-degassed, to give an encapsulated organic EL device. The above inert liquid had a dissolved oxygen concentration of 8.0 ppm, or outside the range limited in the present invention.

The above encapsulated organic EL device was evaluated for encapsulating effects in the same manner as in Example 1(3) except that the second calculation or measurement of a no-light emission area and a dark spot diameter was conducted 115 hours after the initiation of electric application. Tab le 2 shows the results.

TABLE 2

| | No-light emission area ratio (%) | | Diameter of dark spot ($\mu$m) | | |
|---|---|---|---|---|---|
| | Initial | After predetermined period of time | Initial | After predetermined period of time | Growth rate of dark spot ($\mu$m/hour) |
| Ex. 1 | 0.43 | 0.51 | 18.4 | 20.1 | $1.22 \times 10^{-2}$ |
| Ex. 2 | 0.43 | 0.59 | 18.4 | 19.1 | $4.61 \times 10^{-3}$ |
| CEx. 1 | 0.45 | 3.9 | 18.3 | 45.7 | $2.21 \times 10^{-1}$ |
| CEx. 2 | 0.42 | 12.3 | 18.5 | 121.9 | $7.60 \times 10^{-1}$ |
| CEx. 3 | 0.46 | 12.4 | 18.8 | 82.5 | $5.55 \times 10^{-1}$ |

Ex. = Example, CEx. = Comparative Example
*: "After predetermined period of time" in Example 1 stands for 139 hours after the electric application, "After predetermined period of time" in Example 2 stands for 152 hours after the electric application, "After predetermined period of time" in Comparative Example 1 stands for 124 hours after the electric application, "After predetermined period of time" in Comparative Example 2 stands for 136 hours after the electric application, and "After predetermined period of time" in Comparative Example 3 stands for 115 hours after the electric application.

As is shown in Table 2, the encapsulated organic EL devices obtained in Examples 1 and 2 showed almost no changes from initial values in the no-light emission area ratio and the diameter of a dark spot 139 hours or 152 hours after the electric application, and the growth rate of a dark spot in each was also low. These data show that each of the inert liquid layers formed in Examples 1 and 2 firmly prevented the growth of dark spots.

In contrast, in the encapsulated organic EL devices obtained in Comparative Examples 1 to 3, the no-light emission ratios and the diameters of dark spots were greatly larger than their initial values after predetermined periods of time passed after the electric application, and the growth ratio in each Comparative Example was much larger than those ratios in Examples 1 and 2.

EXAMPLE 3

(1) Preparation of inert liquid having a dissolved oxygen concentration of 1 ppm or less An inert liquid having a dissolved oxygen concentration of 0.05 ppm and a water content of 5 ppm was prepared in the same manner as in Example 1(1).

(2) Activation treatment of adsorbent

Activated alumina (supplied by Hiroshima Wako Purechemical Industries Ltd.; particle diameter about 300 mesh) was provided as an adsorbent. A proper amount of the activated alumina was placed in a glass sample container with a vacuum valve, and the sample container and a vacuum pump were connected to each other with a flange.

Then, the above sample container was vacuumed to $10^{-4}$ Torr at room temperature, and while the portion retaining the activated alumina in the above sample container was heated at 280° C. with a heater, the sample container was further vacuumed. The above vacuuming was continued for 5 hours until the generation of gas from the activated alumina was not found so that a vacuum degree was stabilized, and then the vacuum valve was closed for storage.

(3) Encapsulation

The same cap-shaped housing material as the cap-shaped housing material used in Example 1(2) was provided. The housing material and an organic EL device were bonded to each other in the same manner as in Example 1(2), and then the resultant set was vacuum-dried with a vacuum desiccator. The vacuum-dried set was transferred into a gloved box in which the atmosphere was purged with nitrogen gas.

Further, the above sample container containing the inert liquid prepared in the above (1) and the above sample container containing the adsorbent activation-treated in the above (2) were transferred into the above gloved box. Then, a predetermined amount of the adsorbent was charged into the sample container containing the inert liquid, and the mixture was stirred to prepare an inert liquid containing the adsorbent (to be referred to as "mixture liquid" hereinafter). The mixture liquid contained 500 mg of the adsorbent permilliliter of the inert liquid, and the mixture liquid had a dissolved oxygen concentration of 1 ppm or less. Thereafter, the mixture liquid was charged into a space formed by the concave portion of the housing material and the substrate through an inlet provided in the above housing material.

After the charging of the mixture liquid, in the above gloved box, the above inlet was closed with an epoxy resin adhesive (ARALDITE AR-R30, supplied by Ciba Geigy), and the set was allowed to stand in the gloved box for about 3 hours until the adhesive was cured.

Figure 2:
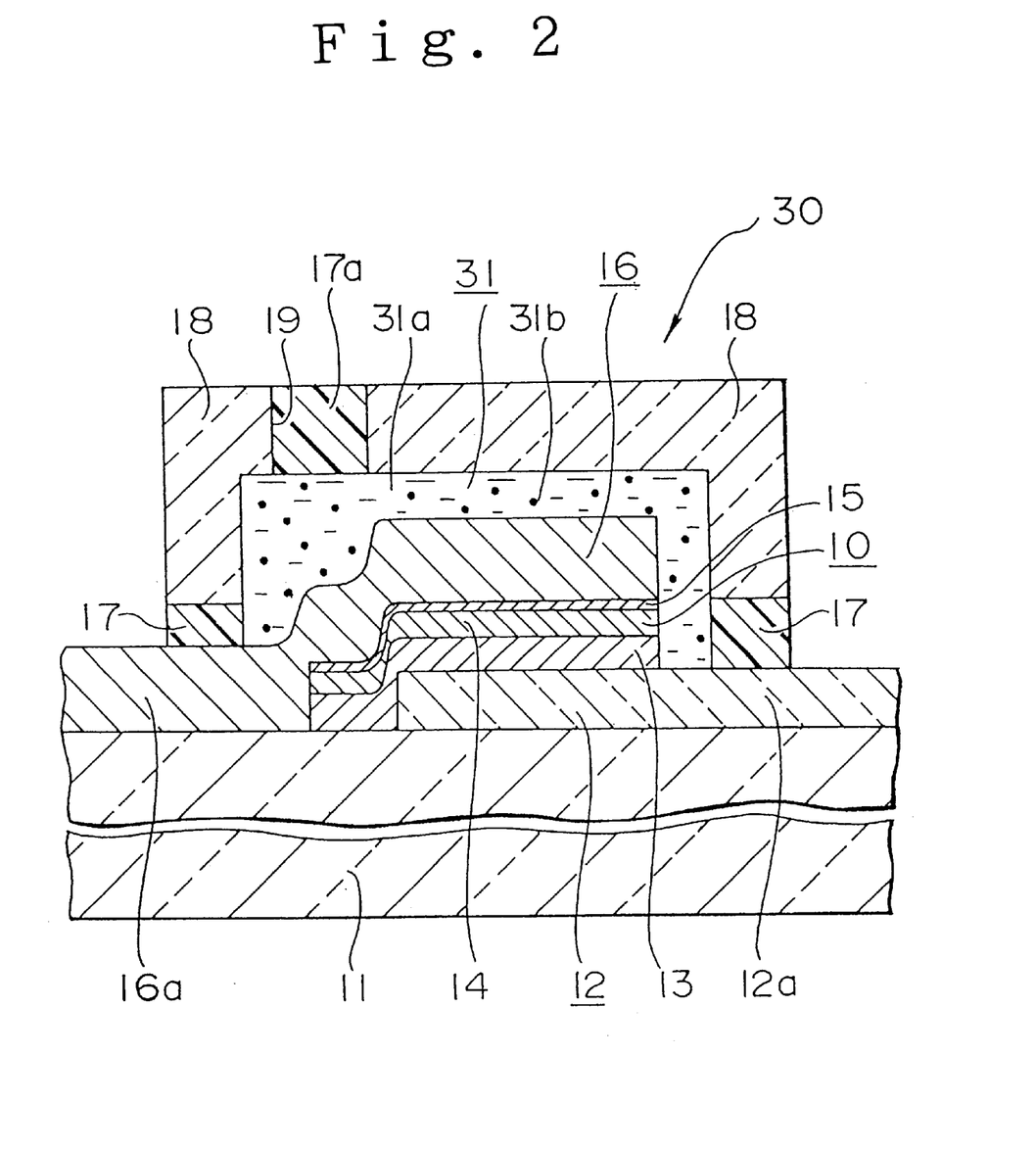
FIG. 2 is a schematic cross sectional view of an encapsulated organic EL device obtained in Example 3.

An inert liquid layer was formed on the periphery of the organic EL device as an encapsulating object by charging the above mixture liquid into the space formed by the concave portion of the housing material and the substrate, whereby the encapsulating as an object was performed. At the same time, an encapsulated organic EL device as an object was obtained. FIG. 2 shows a schematic cross sectional view of the encapsulated organic EL device.

As shown in FIG. 2, the above-obtained encapsulated organic EL device 30 has an inert liquid layer 31 formed on the periphery of an organic EL device 10 as an encapsulating object, the inert liquid layer 31 being formed of mixture liquid (inert liquid containing adsorbent) consisting of an inert liquid 31a prepared in the above (1) and an adsorbent 31b activation-treated in the above (2). In the encapsulated organic EL device shown in FIG. 2, the same members as those in FIG. 1 are shown by the same reference numerals, and explanations thereof are omitted.

(4) Evaluation of encapsulating effects

The encapsulated organic EL device obtained in the above (3) was evaluated for encapsulating effects in the same manner as in Example 1(3) except that the calculation of a no-light emission area ratio and the measurement of a dark spot diameter were conducted 5 days and 30 days after the initiation of electric application. Table 3 shows the results.

EXAMPLE 4

An Mg powder (supplied by Kojundo Chemical Laboratory Co., Ltd.; particle diameter 80 mesh or less) was provided as an adsorbent, and the Mg powder was activation-treated as follows.

First, a proper amount of the Mg powder was placed in a beaker, and a 1M hydrochloric acid aqueous solution was added. The mixture was allowed to stand for several minutes, and then filtered, and the residue (Mg powder) was rinsed with a sufficient amount of anhydrous ethanol. The rinsed residue (Mg powder) was transferred to a glass sample container with a vacuum valve, and the valve of the sample container was closed. The procedures so far were carried out in a gloved box in which dry nitrogen gas had been blown. The above sample container (containing the residue (Mg powder)) of which the valve was closed was taken out of the gloved box, and the Mg powder in the container was subjected to vacuuming in the same manner as in Example 1 until the evaporation of ethanol was not found so that the vacuum degree was stabilized. The above vacuuming was carried out at room temperature without heating a portion retaining the Mg powder in the above sample container.

An organic EL device was encapsulated in the same manner as in Example 3 except that the adsorbent was replaced with the Mg powder which was activation-treated as described above, and at the same time, an encapsulated organic EL device was obtained. In this case, the inert liquid layer contained 500 mg of the adsorbent per milliliter of the inert liquid, and had a dissolved oxygen concentration of 1 ppm or less.

The above encapsulated organic EL device was evaluated for encapsulating effects in the same manner as in Example 3(4). Table 3 shows the results. Example 5 An organic EL device was encapsulated in the same manner as in Example 3 except that the adsorbent was replaced with a powder (particle diameter 300 mesh or less) of $CaSO_4.1/2H_2O$ (calcined gypsum; supplied by Wako Purechemical Industries Ltd.), that the heating temperature by a heater for the activation treatment of the adsorbent was changed to 240° C. and that the mixture liquid was replaced with a mixture liquid (inert liquid containing the inert liquid) containing 200 mg of the adsorbent per milliliter of the inert liquid, and at the same time, an encapsulated organic EL device was obtained. In this case, the inert liquid layer had a dissolved oxygen concentration of 1 ppm or less.

The above encapsulated organic EL device was evaluated for encapsulating effects in the same manner as in Example 3(4). Table 2 shows the results.

Referential Example 1

An organic EL device was encapsulated in the same manner as in Example 3 except that no adsorbent was used. The encapsulated organic EL device was evaluated for encapsulating effects in the same manner as in Example 3(4). Table 3 shows the results.

Comparative Example 4

An organic EL device was encapsulated in the same manner as in Example 3 except that perfluoropolyether (Demnum S-20 (trade name), supplied by Daikin Industries Ltd.) was used as an inert liquid without vacuum-degassing it.

The above encapsulated organic EL device was evaluated for encapsulating effects in the same manner as in Example 3(4). Table 3 shows the results.

Comparative Example 5

An organic EL device was encapsulated in the same manner as in Example 3 except that activated alumina (particle diameter about 300 mesh, supplied by Hiroshima Wako Purechemical Industries Ltd.) was exposed to atmosphere and then used as an adsorbent without activating--treating it. The mixture liquid (inert liquid containing the adsorbent) used for forming an inert liquid layer had a dissolved oxygen concentration of 5.0 ppm or outside the range limited in the present invention, since oxygen adsorbed on the adsorbent was dissolved in the inert liquid.

The above encapsulated organic EL device was evaluated for encapsulating effects in the same manner as in Example 3(4). Table 3 shows the results.

TABLE 3

| | No-light emission area ratio (%) | | | Diameter of dark spot ($\mu$m) | | |
|---|---|---|---|---|---|---|
| | Initial | After 5 days | After 30 days | Initial | After 5 days | After 30 days |
| Ex. 3 | 0.20 | 0.20 | 0.25 | 15 | 15 | 17 |
| Ex. 4 | 0.20 | 0.20 | 0.25 | 15 | 15 | 17 |
| Ex. 5 | 0.20 | 0.20 | 0.25 | 15 | 15 | 17 |
| REx. 1 | 0.20 | 0.25 | 12 | 15 | 17 | 80 |
| CEx. 4 | 0.20 | 4.0 | 50 | 15 | 50 | 300 |
| CEx. 5 | 0.20 | 4.0 | 50 | 15 | 50 | 300 |

Ex. = Example, REx. = Referential Example, CEx. = Comparative Example

As shown in Table 3, in the encapsulated organic EL devices obtained in Examples 3 to 5, the increase of the no-light emission area ratio with the passage of time and the growth of dark spots with the passage of time were firmly prevented.

On the other hand, in the encapsulated organic EL device obtained in Referential Example 1, the increase of the no-light emission area ratio with the passage of time and the growth of dark spots with the passage of time were firmly prevented as compared with the data of the encapsulated organic EL devices obtained in Comparative Examples 4 and 5, while the encapsulating effects were low as compared with the data of the encapsulated organic EL devices obtained in Examples 3 to 5.

Further, in the encapsulated organic EL device obtained in Comparative Example 4, the no-light emission area ratio immensely increased with the passage of time and dark spots immensely grew with the passage of time, and the encapsulating effects were low. In Comparative Example 5 in which the adsorbent was exposed to atmosphere and then used without activation treatment, to form the inert liquid layer having a dissolved oxygen concentration of 5.0 ppm, the no-light emission area ratio immensely increased with the passage of time, and dark spots immensely grew with the passage of time, similarly to the encapsulated organic EL device obtained in Comparative Example 4, and no effect of the use of the adsorbent was found.

As explained above, the method Df the present invention can firmly prevent the growth of dark spots in an organic EL device. The working of the present invention therefore can provide organic EL devices having an increased device life.

We claim:

1. A method of encapsulating an organic electroluminescence device, which comprises providing a layer of an inert liquid having a dissolved oxygen concentration of 1 ppm or less on the periphery of an organic electroluminescence device, the electroluminescence device being formed by laminating an anode and a cathode through at least a light-emitting layer.

2. The method of claim 1, wherein the inert liquid has a water content of 10 ppm or less.

3. The method of claim 1, wherein the inert liquid inert liquid is a liquid fluorinated carbon having a vapor pressure of $10^{-2}$ Torr or less at 25° C.

4. The method of claim 1, which further comprises providing a housing material which covers the organic electroluminescence device, said electroluminescence device being formed on a substrate, which forms a space between the organic electroluminescence device and the housing material, and filling the inert liquid having a dissolved oxygen concentration of 1 ppm or less in said space.

5. The method of claim 1, wherein the inert liquid is an inert liquid containing an adsorbent.

6. The method of claim 5, wherein the adsorbent is selected from the group consisting of
   (a) an inorganic compound selected from the group consisting of activated alumina, diatomaceous earth, activated carbon, hemihydrated gypsum, phosphorus pentoxide, magnesium perchlorate, potassium hydroxide, calcium sulfate, calcium bromide, calcium oxide, zinc chloride, zinc bromide and anhydrous copper sulfate,
   (b) a metal selected from the group consisting of lithium, beryllium, potassium, sodium, magnesium, rubidium, strontium and calcium, or an alloy thereof, and
   (c) an acrylic water-absorption polymer or a methacrylic water-absorption polymer.

7. The method of claim 5, wherein the adsorbent is an adsorbent which is activation-treated.

8. The method of claim 5, wherein the inert liquid contains 1 mg to 10 g of the adsorbent per milliliter of the inert liquid.

9. The method of claim 5, wherein the inert liquid is an inert liquid having a water content of 10 ppm or less.

10. The method of claim 5, wherein the inert liquid is a liquid fluorinated carbon having a vapor pressure of $10^{-2}$ Torr or less at 25° C.

11. The method of claim 5, wherein the layer of the inert liquid containing the adsorbent is formed by providing a housing material which covers the organic electroluminescence device, said electroluminescence device being formed on a substrate, which forms a space between the organic electroluminescence device and the housing material, and filling the inert liquid in said space.

12. The method of claim 1, wherein the dissolved oxygen concentration is 0.01 to 1 ppm.

13. An encapsulated organic electroluminescence device comprising an organic device formed by laminating an anode and a cathode through at least a light-emitting layer, and a layer of an inert liquid which is provided on the periphery of the organic electroluminescence device, the layer of the inert liquid having a dissolved oxygen concentration of 1 ppm or less.

14. The encapsulated organic electroluminescence device of claim 13, wherein the inert liquid has a water content of 10 ppm or less.

15. The encapsulated organic electroluminescence device of claim 13, wherein the inert liquid is a liquid fluorinated carbon having a vapor pressure of $10^{-2}$ Torr or less at 25° C.

16. The encapsulated organic electroluminescence device of claim 13, wherein the layer of the inert liquid is formed of an inert liquid containing an adsorbent.

17. The encapsulated organic electroluminescence device of claim 16, wherein the adsorbent is selected from the group consisting of
   (a) an inorganic compound selected from the group consisting of activated alumina, diatomaceous earth, activated carbon, hemihydrated gypsum, phosphorus pentoxide, magnesium perchlorate, potassium hydroxide, calcium sulfate, calcium bromide, calcium oxide, zinc chloride, zinc bromide and anhydrous copper sulfate,
   (b) a metal selected from the group consisting of lithium, beryllium, potassium, sodium, magnesium, rubidium, strontium and calcium, or an alloy thereof, and
   (c) an acrylic water-absorption polymer or a methacrylic water-absorption polymer.

18. The encapsulated organic electroluminescence device of claim 16, wherein the adsorbent is an activation-treated adsorbent.

19. The encapsulated organic electroluminescence device of claim 16 wherein the inert liquid contains 1 mg to 10 g of the adsorbent per milliliter of the inert liquid.

20. The encapsulated organic electroluminescence device of claim 13 wherein the organic electroluminescence device is formed on a substrate, and which further comprises a housing material which covers the organic electroluminescence device formed on the substrate, which forms a space between the organic electroluminescence device and the housing material, and the layer of the inert liquid is formed in said space.

* * * * *